(12) United States Patent
Oddoart et al.

(10) Patent No.: US 8,000,821 B2
(45) Date of Patent: Aug. 16, 2011

(54) AUDIO COMMUNICATION UNIT AND INTEGRATED CIRCUIT

(75) Inventors: Ludovic Oddoart, Frouzins (FR); Gerhard Trauth, Muret (FR)

(73) Assignee: Freescale Semiconductor, Inc., Austin, TX (US)

( * ) Notice: Subject to any disclaimer, the term of this patent is extended or adjusted under 35 U.S.C. 154(b) by 741 days.

(21) Appl. No.: 11/815,177

(22) PCT Filed: Jan. 31, 2005

(86) PCT No.: PCT/IB2005/000445
§ 371 (c)(1),
(2), (4) Date: Apr. 3, 2008

(87) PCT Pub. No.: WO2006/079869
PCT Pub. Date: Aug. 3, 2006

(65) Prior Publication Data
US 2008/0268807 A1 Oct. 30, 2008

(51) Int. Cl.
*G06F 17/00* (2006.01)
(52) U.S. Cl. ........................................... 700/94
(58) Field of Classification Search ............ 700/94; 381/28, 120; 330/207 A, 250; 375/347–252, 375/238, 316
See application file for complete search history.

(56) References Cited

U.S. PATENT DOCUMENTS

| | | | | |
|---|---|---|---|---|
| 5,777,512 | A * | 7/1998 | Tripathi et al. | 330/207 A |
| 5,974,089 | A * | 10/1999 | Tripathi et al. | 375/247 |
| 6,380,881 | B2 * | 4/2002 | Harada et al. | 341/165 |
| 7,138,859 | B2 * | 11/2006 | Ohara et al. | 330/10 |
| 7,378,904 | B2 * | 5/2008 | Risbo | 330/10 |
| 2005/0083116 | A1 * | 4/2005 | Risbo et al. | 330/10 |

FOREIGN PATENT DOCUMENTS

EP 1158663 B1 10/2006

OTHER PUBLICATIONS

"A Low Power Low Voltage Class D Amp Based on Sigma-Delta and Bang-Bang Control," Tong et al. Copyright 2000 IEEE 2004 IEEE International Workshop on Biiomedial Circuits & Systems.*
Horowitz et al; "The Art of Electronics, 2nd Edition", 1989, Cambridge, UK, pp. 775-776, fig 11.15.

* cited by examiner

*Primary Examiner* — Andrew C Flanders

(57) ABSTRACT

An audio communication unit comprises a receiver for receiving an audio signal, a sigma-delta modulator operably coupled to the receiver and arranged to modulate the received audio signal, and a class-D amplifier stage operably coupled to the sigma-delta modulator and arranged to amplify the modulated received audio signal. One or more feedback path (s) is/are arranged from an output of the class-D amplifier stage to the sigma-delta modulator. The provision of one or more feedback path(s) from the output of the class-D audio amplifier to the sigma-delta modulator facilitates smaller die size; higher power efficiency and power supply rejection ratio/intermodulation cancellation performance.

18 Claims, 3 Drawing Sheets

500

600

AUDIO COMMUNICATION UNIT AND INTEGRATED CIRCUIT

FIELD OF THE INVENTION

This invention relates to class-D audio amplifiers suitable for audio communication units. The invention is applicable to, but not limited to, class-D audio power amplifiers for use with an analogue sigma-delta modulator arrangement.

BACKGROUND OF THE INVENTION

Class-D amplifiers are often used in electrical circuits when high efficiency is required. For example, in battery-powered wireless communication devices utilise class-D audio amplifiers in order to provide a higher theoretical maximum efficiency of amplification of audio signals (up to 100%), as compared to the theoretical maximum efficiency of less efficient amplifier topographies, such as class AB audio amplifiers (up to 78% efficient). Class-D audio amplifiers minimize power dissipation in the output stages by working in a linear operating region only (e.g. the well-known transconductance region). This is illustrated in FIG. 1, which shows a graph 100 of a drain-source voltage 105 versus drain-source current 110 for a class-D amplifier, indicating the transconductance region 120.

One advantage in employing class-D amplifiers is the reduction in the required surface area of silicon. This is due to the fact that a power metal oxide semiconductor (MOS) device is sized with respect to the intrinsic resistance (Ron) associated with the power stage of the class-D transistors when operating in a switch region 115. This is compared to the size of a MOS device being dependent on the saturation voltage in a class AB device.

Referring now to FIG. 2, a classic class-D amplifier (analogue) topology is illustrated. The topology is illustrated within a classic pulse wave modulator (PWM) 225 design. As known, the PWM 225 converts an analogue input 210 having a given bandwidth 215 into a 1-bit digital stream 230. In terms of spectrum usage, this digital stream 230 therefore includes an analogue input spectrum and its alias, repeated at the sampling frequency 255. This digital stream 230 is configured to drive a bridged power stage 235, which delivers power to the speaker 240.

In this manner, a classic class-D amplifier topology offers the advantage of greater efficiency and reduced power dissipation over class AB power amplifiers. Furthermore, and notably, class-D amplifiers do not require the use of a specific common mode reference.

However, this known prior art has the disadvantage that, in general, class-D audio power amplifiers are renowned as having a poor behavior if there are perturbations in the power source, for example when a battery is used. This poor behavior is accountable to a large degree by inter-modulated frequency components between the supply and the audio signal. Consequently, class-D amplifiers do not lend themselves readily to use in wireless communication devices, where a reliable and consistent power source cannot be guaranteed.

Furthermore, it is also known that the power gain provided by class-D power amplifiers is dependent upon the power supply. Such a dependency, requiring a consistent and stable power supply, is undesirable. Again, this is particularly the case in portable (battery-powered) devices, such as mobile phones, where the battery voltage continuously varies over the life of the battery.

The aforementioned problems with analogue designs are also applicable to class D audio power amplifiers that incorporate a digital PWM design. Furthermore, with a digital design, over-sampling of the digital stream is required, which adds yet further complexity to the design.

Thus, a mechanism to improve the performance of an audio amplifier is needed, particularly one with high efficiency and immunity to supply variations. In particular, a mechanism to reduce the performance dependency of class-D amplifiers on power supply, particularly in the context of audio power amplifiers in a wireless communication device, would be advantageous.

A need therefore exists for an improved arrangement wherein the abovementioned disadvantages may be alleviated.

STATEMENT OF INVENTION

In accordance with the preferred embodiment of the present invention, there is provided an audio communication unit, an integrated circuit having a sigma-delta modulator and class-D amplifier arrangement class-D amplifier, as claimed in the accompanying Claims.

Figure 1:
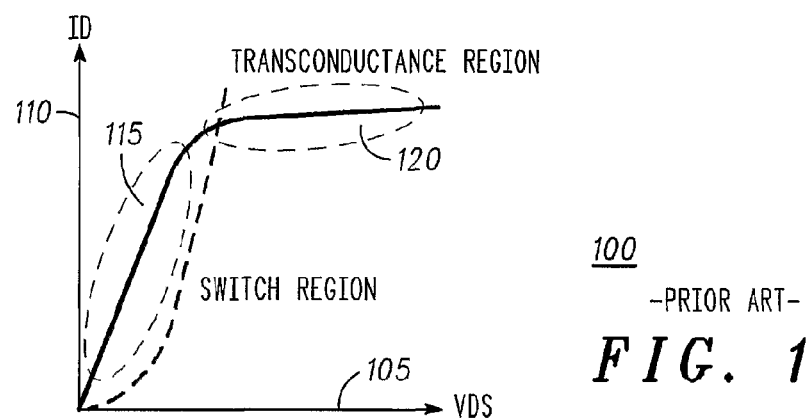
FIG. 1 illustrates a graph of Vds versus Ids for a class-D amplifier.
Figure 2:
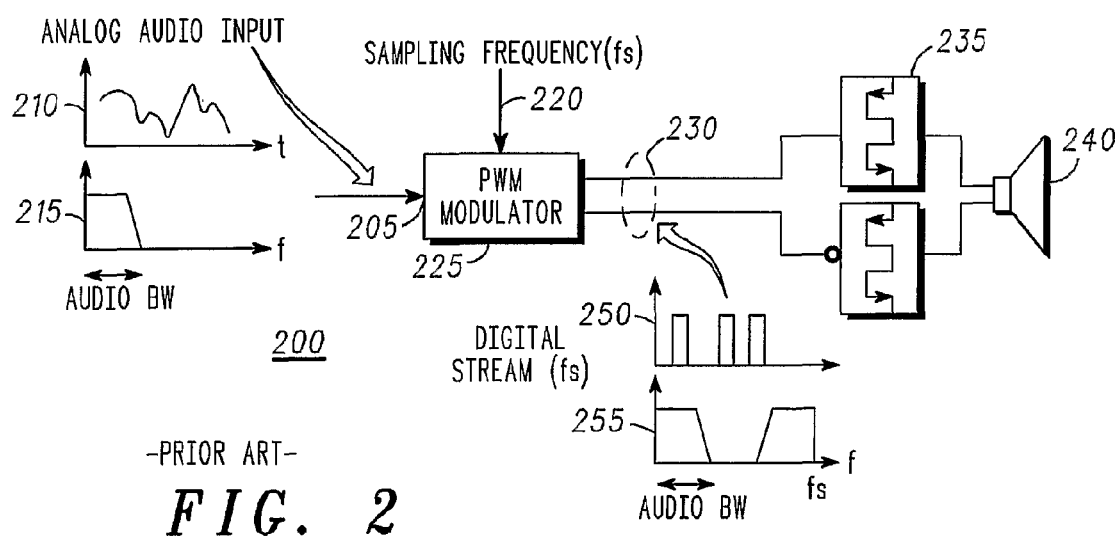
FIG. 2 illustrates a classic class-D amplifier (analogue) topology.
Figure 3:
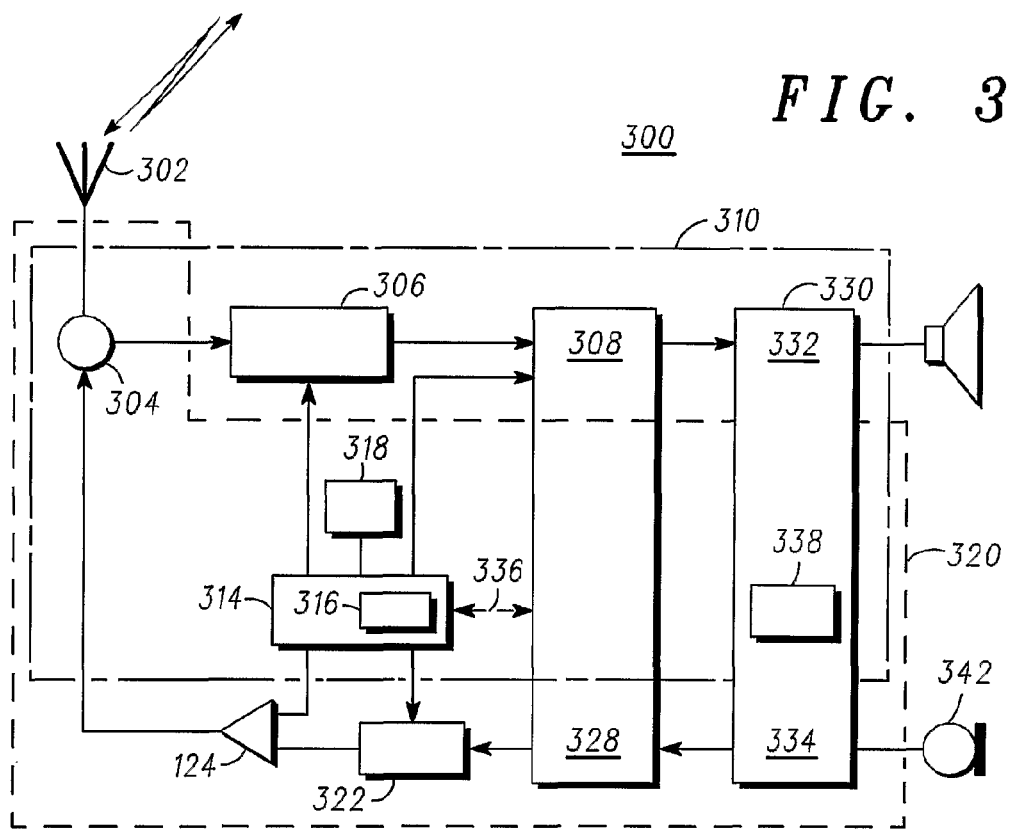
Figure 4:
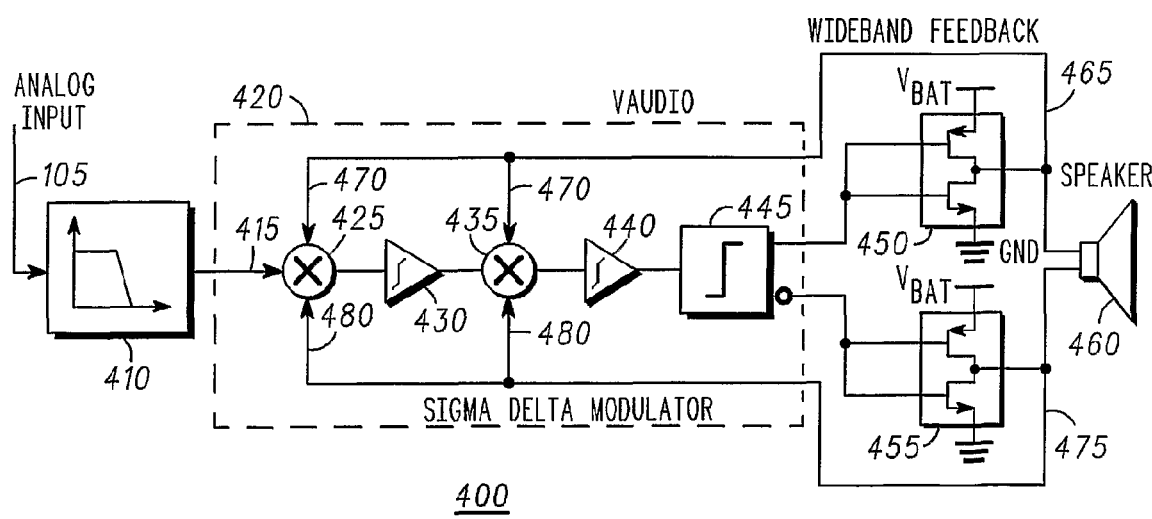
Figure 5:
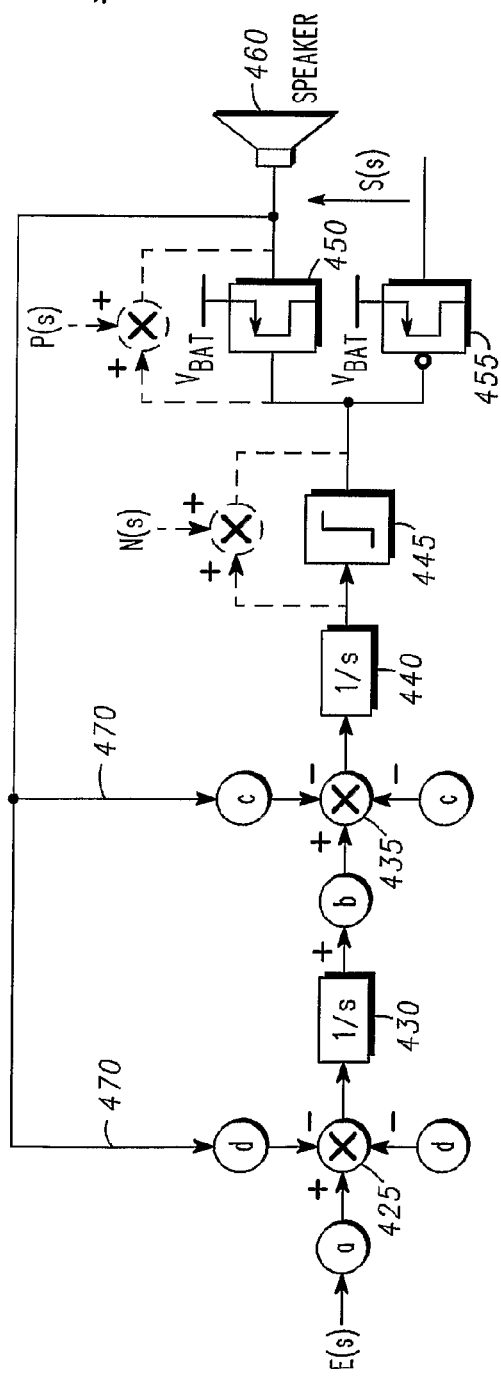
Figure 6:
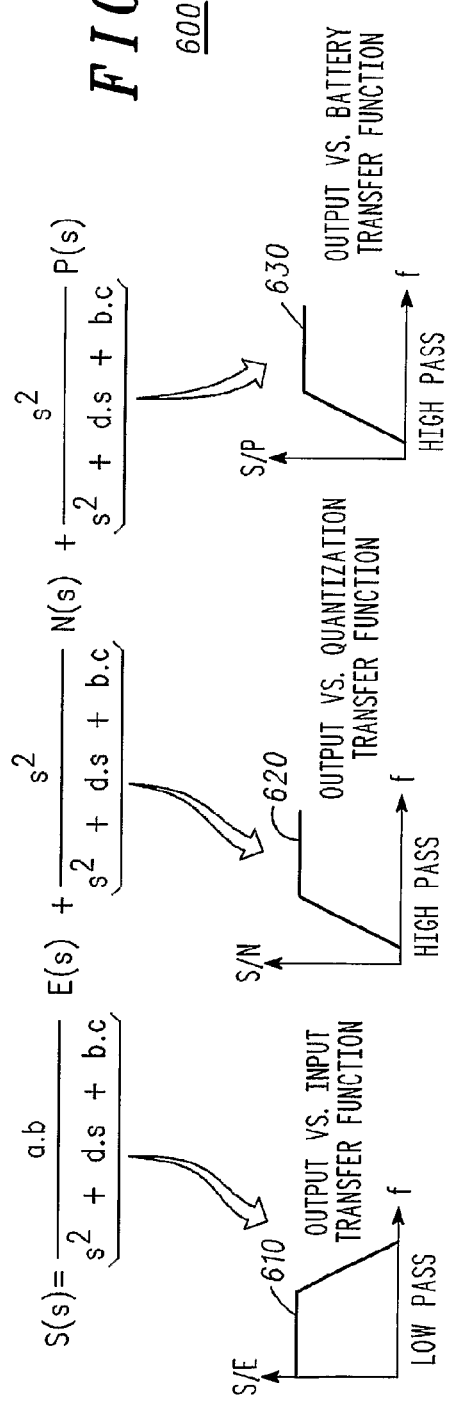

Embodiments of the present invention will now be described, by way of example only, with reference to the accompanying drawings, in which:

FIG. 3 illustrates a simplified block diagram representation of a speech communication unit, adapted in accordance with a preferred embodiment of the present invention;

FIG. 4 illustrates a sigma-delta modulator and an audio class-D amplifier stage adapted in accordance with the preferred embodiment of the present invention;

FIG. 5 illustrates a circuit model of the sigma-delta modulator and audio class-D amplifier stage of FIG. 4, adapted in accordance with the preferred embodiment of the present invention; and FIG. 6 illustrates frequency responses associated with various sections of the circuits of FIG. 4 and FIG. 5.

DESCRIPTION OF PREFERRED EMBODIMENTS

In summary, the preferred embodiment of the present invention provides an audio amplifier, for example one suitable for use with a communication unit comprising a receiver for receiving an audio signal. A sigma-delta modulator is operably coupled to the receiver and arranged to modulate the received audio signal. A class-D amplifier stage (of the audio amplifier) is operably coupled to the sigma-delta modulator and arranged to amplify the modulated received audio signal. One or more feedback path(s) is/are arranged from an output of the class-D amplifier stage to the sigma-delta modulator.

The provision of one or more feedback path(s) from the output of the class-D audio amplifier to the sigma-delta modulator facilitates the improvement of power supply rejection ratio/intermodulation cancellation performance.

Referring now to FIG. 3, there is shown a block diagram of a wireless communication unit 300, adapted to support the inventive concept of the preferred embodiments of the present invention. Although the preferred embodiment of the present invention is described with reference to a wireless communication unit such as a cellular phone, it is within the contemplation of the invention that the inventive concept can be equally applied to any audio amplification circuit.

For example, the wireless communication unit 300 containing an antenna 302 preferably coupled to a duplex filter or antenna switch 304 that provides isolation between a receiver chain and a transmitter chain within the wireless communication unit 300. As also known in the art, the receiver chain typically includes a receiver front-end circuit 306 (effectively providing reception, filtering and intermediate or base-band frequency conversion). The receiver front-end circuit is serially coupled to a signal processing function 308. In accordance with the preferred embodiment of the present invention, the signal processing function 308 comprises a sigma-delta modulator function or circuit. An output from the signal processing function 308 is provided to a suitable output device 310, such as a speaker via a speech-processing unit 330. The speech processing unit 330 preferably comprises an audio amplifier device 338, which has been adapted according to the inventive concepts hereinafter described with respect to subsequent FIGs.

The speech-processing unit 330 includes a speech encoding function 334 to encode a user's speech signals into a format suitable for transmitting over the transmission medium. The speech-processing unit 330 also includes a speech decoding function 332 that decodes received speech signals into a format suitable for outputting via speaker 310.

The speech-processing unit 330 is operably coupled to a memory unit 316, via link 336, and a timer 318 via a controller 314. The controller 314 is also coupled to the receiver front-end circuit 306 and the signal processing function 308 (generally realised by a digital signal processor (DSP)). The controller 314 may therefore receive bit error rate (BER) or frame error rate (FER) data from recovered information. The controller 314 is coupled to the memory device 316 for storing operating regimes, such as decoding/encoding functions and the like. A timer 318 is typically coupled to the controller 314 to control the timing of operations (transmission or reception of time-dependent signals) within the wireless communication unit 300.

For completeness, as regards the transmit chain, this essentially includes an input device 320, such as a microphone transducer coupled in series via speech encoder 334 to a transmitter/modulation circuit 322. Thereafter, any transmit signal is passed through a power amplifier 324 to be radiated from the antenna 302. The transmitter/modulation circuit 322 and the power amplifier 324 are operationally responsive to the controller, with an output from the power amplifier coupled to the duplex filter or antenna switch 304. The transmitter/modulation circuitry 322 and receiver front-end circuitry 306 comprise frequency up-conversion and frequency down-conversion functions (not shown).

Of course, the various components and circuits within the wireless communication unit 300 can be arranged in any suitable functional topology able to utilise the inventive concepts of the present invention. Furthermore, the various components within the speech communication unit 300 can be realised in discrete or integrated component form, with an ultimate structure therefore being merely an application-specific selection.

Referring now to FIG. 4, a sigma-delta modulator and an audio amplifier stage 400 is illustrated in accordance with the preferred embodiment of the present invention. The arrangement comprises an anti-aliasing filter 410 that receives an analogue input speech signal, and suppresses high frequency noise as well as minimises any potential for in-band aliasing after sampling in the following sigma-delta modulator stage 420.

In the preferred embodiment of the present invention, the sigma-delta modulator stage 420 is a classic $2^{nd}$ order sigma-delta modulator, feeding into a dedicated class-D amplifier arrangement 465. The sigma-delta modulator comprises two integrators 430 and 440, with two signal subtractors 425 and 435. An output from the second integrator 440 is input to a comparator (or quantizer) 445. The comparator 445 is a one-bit comparator, termed a quantizer.

It is also envisaged that the circuit is able to work with a '1.5' bit comparator. A 1-bit comparator is able to have different outputs '1' or '0', depending upon its input (e.g. the output of the last integrator in a sigma-delta modulator). When the output is a '1', the power stage 450 delivers BAT at the power output, where a '0' the power stage 450 delivers GND at the power output. With a '1.5' bit comparator, a further state is allowed, depending upon the last integrator output in the sigma-delta modulator, where the comparator is able to indicate to power drivers 450, 455 to switch into 'idle' mode (a high impedance output). This technique may be used to push the shaping to a higher frequency avoiding the use of a higher order in the sigma-delta modulator. Although the preferred embodiment of the present invention is described with reference to a second order sigma-delta arrangement, it is within the contemplation of the present invention that the inventive concept is equally applicable to any sigma-delta order selected.

The sigma-delta modulator stage 420 delivers, via the one-bit comparator, a one-bit data stream that drives a bridged class-D power stage 450, 455 arranged to deliver audio power to the speaker 460.

Notably, a primary difference of the preferred embodiment of the present invention, when compared to a classic open loop system, is the feedback paths 465 and 475. The feedback paths 465 and 475 are, by design, wideband in nature, since this feedback is performed at the same frequency used to sample the analogue audio input 415.

This use of a high power, wideband feedback path, is arranged from the output of the audio class-D power amplifier stage instead of at the output of the comparator in a classic sigma-delta feedback scenario. This advantageously enables perturbations from the supply voltage to be "shaped", as power supply effects on the class-D amplifier are taken into account within the feedback loop.

Referring now to FIG. 5 a circuit model 500 of the aforementioned class-D audio amplifier and sigma-delta modulator arrangement 400 of FIG. 4 is shown, illustrating the circuit's transfer function. FIG. 6 illustrates the frequency response associated with various sections of the circuits of FIG. 4 and FIG. 5, together with the corresponding equations. In particular, the circuit model 500 illustrates the benefits of the aforementioned proposed class-D audio amplifier structure being adapted to provide a wideband analogue feedback path. Notably, the provision of a 'wideband' feedback path facilitates suppression of power supply/battery perturbations, as described below.

In FIG. 6:
$E(s)$ is the analogue input;
$S(s)$ is the power output;
$N(s)$ is the quantization given by the comparator (as in a classic sigma-delta arrangement); and
$P(s)$ are the supply perturbations provided to $S(s)$ through the power drivers.

By performing the calculation in FIG. 6, the following may be deduced:
(i) The signal transfer function: $S(s)/E(s)$ equates to a low pass filter response 610.
(ii) The signal transfer function: $S(s)/N(s)$ is the transfer from quantization noise created by the comparator to the output. This equates to a high pass filter response 620, as in a classic sigma-delta modulator.
(iii) The signal transfer function: $S(s)/P(s)$ is the transfer function from supply to output. This equates to a high pass filter response 630.

As in a classic sigma-delta modulator arrangement, the quantization noise is high-pass filtered. In the audio bandwidth of interest the noise injected N(s) is attenuated by the filter. Advantageously, the same mechanism is applied to perturbations provided by the supply P(s), in accordance with the preferred embodiment of the present invention. This allows battery perturbations to be rejected by the high-pass filtering nature of the circuit. Thus, with regard to a third transfer function of the circuit of FIG. 4 and circuit model of FIG. 5, it can be seen that battery perturbations are 'shaped', e.g. removed, by the sigma-delta loop. Alternatively, the low-pass filter transfer function allows the audio input to be amplified up to the output power in the given bandwidth of interest with a flat frequency response.

Thus, with regard to the frequency responses, the signal transfer is low pass, so audio is amplified with no attenuation. The noise/battery transfer function is high-pass, therefore perturbations are suppressed. In the context of the present invention, the audio frequency range is from 20 Hz to 20 kHz. Thus, a sigma delta order and frequency are selected to obtain an audio transfer function which is flat up to 20 kHz. Suppression has to be performed in the frequency range where perturbations are audible (up to 20 kHz). For example, in an audio communication unit. Such as a mobile phone compliant with the Global System for Mobile communication (GSM) standard, battery voltage is perturbed at 217 Hz. This is extremely audible and often referred to as 'buzz' acoustic specialists if not suppressed.

Thus, a yet further advantage provided by this design is that the gain of the audio amplifier circuit does not depend upon the (potentially variable) level of battery voltage. This makes the inventive concept particularly applicable to use with class-D amplifiers. It is noteworthy that analog sigma-delta modulators are typically used for A/D converters, and as such are commonly followed by a digital filter (decimator) and not by an (analogue) power driver as described.

Thus, according to the preferred embodiment of the present invention, the proposed class-D audio amplifier arrangement has been adapted to use the digital bit steam to directly drive a power H-Bridge and provide a wideband feedback to the modulator, thereby negating the effect of power supply perturbations.

It is known that class D amplifiers are inherently efficient. Therefore, it is useful to identify how efficient the circuit is with the proposed sigma-delta modulator arrangement. The efficiency of the circuit may be defined by the following equation:

$$N_{eff} = \frac{\frac{Vout^2_{Audio}}{Zspk_{Audio}}}{\underbrace{\frac{Vout^2_{Audio}}{Zspk_{Audio}}}_{\text{Active Power}} + \underbrace{\frac{Vout^2_{fs}}{Zspk_{fs}}}_{\substack{\text{Aliased} \\ \text{Lost Power} \\ (Zspk=100 \text{ ohms})}} + \underbrace{\left(\frac{Vout_{Audio}}{Zspk_{Audio}}\right)^2 \cdot Ron}_{\substack{\text{Power Driver} \\ \text{ON Resistance Loss} \\ (Ron=0.5 \text{ to 1 ohms})}} + \underbrace{Vaudio \cdot Icc}_{\substack{\text{Modulator} \\ \text{Consumption}}}}$$

As illustrated, the efficiency of the circuit is dependent upon the associated losses, when active power is applied.

The active power is dictated by the square of the in-band audio voltage divided by the speaker's impedance. The primary losses relate to the power lost in the aliased frequency, losses within the power driver and the power consumed in the modulator.

It is known that a modulator effectively repeats the input spectrum at the sampling frequency. In this manner, a class-D amplifier arrangement produces a high frequency component (which equates to a power loss) from an image of the input signal applied to the speaker.

In order to minimise losses, the impedance seen by the aliased component has to be as high as possible. Since the speaker impedance is increasing with frequency thanks to its intrinsic inductive characteristic, the loss will be minimised if the sampling frequency is high. In this manner, the aliased frequency is pushed to a high frequency, and therefore reduced in power due to the speaker's input impedance.

Thus, a sigma-delta modulator and audio amplifier arrangement, with a wideband feedback, is designed to minimise losses, as the increase of the sampling frequency can be implemented with minimal cost or complexity. Furthermore, the use of a high sampling frequency avoids the use of passive blocking filters. In a classic sigma-delta topology, the sampling frequency (and consequently the sigma-delta order) has to be selected depending upon the characteristics of the interested bandwidth, taking into account in-band noise, etc. In the preferred embodiment of the present invention, this is the audio bandwidth of 20 Hz to 20 kHz. As mentioned, in the preferred Class-D amplifier embodiment of the present invention, the selection of the sampling frequency (and thereby the sigma-delta order) has also to be carefully considered in order to minimise the aliased component losses. In this sense, a compromise has to be made in order to push the sampling frequency into a domain where the speaker impedance is at its highest value.

It is within the contemplation of the present invention that the sigma-delta modulator and audio class-D amplifier arrangement may be employed in numerous applications, and is therefore not limited to a wireless communication unit as described above with respect to FIG. 3. In particular, the preferred arrangement facilitates the realization of a structure that can be readily implemented in a portable, high signal-to-noise, high PSRR (mono or stereo) application, such as hands free phone usage, MP3 players, and any other audio entertainment equipment.

It is envisaged that the aforementioned inventive concept may also be embodied in any suitable semiconductor device or devices. For example, a semiconductor manufacturer may employ the inventive concepts in a design of a stand-alone integrated circuit (IC) and/or application specific integrated circuit (ASIC) and/or any other sub-system element that may encompass or be configured to be operably coupled to the sigma-delta modulator and/or audio amplifier.

The class-D audio power amplifier arrangement, as described above that uses a digital sigma-delta modulator arrangement, aims to provide at least one or more of the following advantages in the context, say, of an implementation on an integrated circuit:

(i) Smaller die size;
(ii) Higher power efficiency;
(iii) Reduced in-package losses;
(iv) Power Supply Rejection Ratio (PSRR)/Intermodulation cancellation;
(v) Elimination of extra (passive) filters on an audio transducer, thereby saving component count, cost and board space;
(vi) Audio gain that is independent of the power supply;
(vii) High Total Harmonic Distortion (THD) performance;
(viii) Improved noise performance; and
(ix) Suppression of battery perturbations, particularly in a wireless cellular environment.

Whilst specific, and preferred, implementations of the present invention are described above, it is clear that one skilled in the art could readily apply variations and modifications of such inventive concepts.

Thus, an improved class-D audio power amplifier arrangement for an audio communication unit, for example one that uses a digital sigma-delta modulator arrangement, has been described wherein the abovementioned disadvantages associated with prior art arrangements has been substantially alleviated.

The invention claimed is:

1. An audio communication unit comprising:
a receiver for receiving an audio signal;
a sigma-delta modulator operably coupled to the receiver, the sigma-delta modulator arranged to modulate the received audio signal, the sigma-delta modulator comprises first and second integrators each having a respective input operably coupled to a respective output of two signal subtractors, an output from the second integrator is input to an one-and-a-half bit comparator having first, second, and third output states, the one-and-a-half bit comparator provides a high pass filter response of the received audio signal to provide supply voltage immunity into the class-D power amplifier stage, and the third output state, which is a high impedance output state of the comparator, that indicates to the class-D amplifier stage to switch to an idle mode;
a class-D amplifier stage operably coupled to the sigma-delta modulator, the class-D amplifier stage arranged to amplify the modulated received audio signal, and
one or more feedback paths arranged from an output of the class-D amplifier stage to the two signal subtractors of the sigma-delta modulator, the one or more feedback paths provide amplified modulated signals to respective inputs of the two signal subtractors.

2. The audio communication unit according to claim 1 wherein the class-D amplifier stage comprises a class-D audio power amplifier.

3. The audio communication unit according to claim 1 wherein a high sampling frequency is applied to the sigma-delta modulator.

4. The audio communication unit according to claim 1 wherein the audio communication unit is a wireless speech communication unit.

5. An integrated circuit comprising:
a sigma-delta modulator arranged to modulate an audio signal, the sigma-delta modulator comprises first and second integrators each having a respective input operably coupled to a respective output of two signal subtractors, an output from the second integrator is input to an one-and-a-half bit comparator having first, second, third output states, the one-and-a-half bit comparator provides a high pass filter response of the received audio signal thereby providing supply voltage immunity into the class-D power amplifier stage, and the third output state, which is a high impedance output state of the comparator, that indicates to the class-D amplifier stage to switch to an idle mode;
a class-D amplifier stage operably coupled to the sigma-delta modulator, the class-D amplifier stage for amplifying the modulated audio signal; and
one or more feedback paths arranged from an output of the class-D amplifier stage to respective inputs of the two signal subtractors of the sigma-delta modulator, the one or more feedback paths provide amplified modulated signals to the two signal subtractors.

6. The integrated circuit according to claim 5 wherein the class-D amplifier stage comprises a class-D audio power amplifier.

7. The integrated circuit according to claim 5 wherein a high sampling frequency is applied to the sigma-delta modulator thereby reducing component losses.

8. The audio communication unit according to claim 2 wherein a high sampling frequency is applied to the sigma-delta modulator.

9. The audio communication unit according to claim 2 wherein the audio communication unit is a wireless speech communication unit.

10. The audio communication unit according to claim 1 wherein a high sampling frequency is applied to the sigma-delta modulator.

11. The audio communication unit according to claim 1 wherein the audio communication unit is a wireless speech communication unit.

12. The audio communication unit according to claim 3 wherein the audio communication unit is a wireless speech communication unit.

13. The integrated circuit according to claim 6 wherein a high sampling frequency is applied to the sigma-delta modulator thereby reducing component losses.

14. The integrated circuit according to claim 5 wherein a high sampling frequency is applied to the sigma-delta modulator thereby reducing component losses.

15. The audio communication unit of claim 1 wherein the modulated received audio signal is a first differential signal provided from the one-and-a-half bit comparator to the class-D amplifier stage, and the class-D amplifier stage provides the amplified modulated signals as a second differential signal to a load.

16. The audio communication unit of claim 15 wherein the second differential signal from the class-D amplifier stage is provided to each of the two signal subtractors via the one or more feedback paths.

17. The integrated circuit of claim 5 wherein the modulated audio signal is a first differential signal provided from the one-and-a-half bit comparator to the class-D amplifier stage, and the class-D amplifier stage provides the amplified modulated signals as a second differential signal to a load.

18. The integrated circuit of claim 17 wherein the second differential output signal from the class-D amplifier stage is provided to each of the two signal subtractors via the one or more feedback paths.

* * * * *